(12) United States Patent
Bencher et al.

(10) Patent No.: US 7,709,396 B2
(45) Date of Patent: May 4, 2010

(54) INTEGRAL PATTERNING OF LARGE FEATURES ALONG WITH ARRAY USING SPACER MASK PATTERNING PROCESS FLOW

(75) Inventors: Christopher Dennis Bencher, San Jose, CA (US); Jing Tang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 29 days.

(21) Appl. No.: 12/234,101

(22) Filed: Sep. 19, 2008

(65) Prior Publication Data

US 2010/0075503 A1    Mar. 25, 2010

(51) Int. Cl.
*H01L 21/214* (2006.01)
*H01L 21/483* (2006.01)

(52) U.S. Cl. .................. 438/736; 438/597; 438/689; 438/717; 438/950

(58) Field of Classification Search ............. 438/717, 438/736, 950
See application file for complete search history.

(56) References Cited

U.S. PATENT DOCUMENTS

| | | | |
|---|---|---|---|
| 5,328,810 | A | 7/1994 | Lowrey et al. |
| 6,037,266 | A | 3/2000 | Tao et al. |
| 6,573,030 | B1 | 6/2003 | Fairbaim et al. |
| 6,677,242 | B1 | 1/2004 | Liu et al. |
| 6,924,191 | B2 | 8/2005 | Liu et al. |
| 7,115,525 | B2 | 10/2006 | Abatchev et al. |
| 2005/0090120 | A1* | 4/2005 | Hasegawa et al. ........... 438/738 |
| 2006/0046484 | A1* | 3/2006 | Abatchev et al. ........... 438/689 |
| 2006/0211260 | A1* | 9/2006 | Tran et al. .................... 438/763 |
| 2006/0216923 | A1* | 9/2006 | Tran et al. .................... 438/622 |
| 2007/0099431 | A1* | 5/2007 | Li ............................... 438/735 |
| 2008/0162781 | A1* | 7/2008 | Haller et al. ................ 711/101 |

FOREIGN PATENT DOCUMENTS

KR    2000-0044928    7/2000

OTHER PUBLICATIONS

"APF® Pitch-Halving for 2nm Logic Cells using Gridded Design Rules", Tele Innovations, Inc. & Applied Materials, Inc., 8 pp.
"A Negative Spacer Lithography Process for Sub-100nm Contact Holes and Vies", University of California at Berkeley, 4 pp.
"A Study of CD Budget in Spacer Patterning Process", Toshiba, SPIE 2008, Feb. 26, 2008, 12 pp.

(Continued)

*Primary Examiner*—Charles D Garber
*Assistant Examiner*—Angel Roman
(74) *Attorney, Agent, or Firm*—Townsend and Townsend and Crew, LLP (57) ABSTRACT

Embodiments of the present invention pertain to methods of forming patterned features on a substrate having an increased density (i.e. reduced pitch) as compared to what is possible using standard photolithography processing techniques using a single high-resolution photomask while also allowing both the width of the patterned features and spacing (trench width) between the patterned features to vary within an integrated circuit.

22 Claims, 8 Drawing Sheets

OTHER PUBLICATIONS

Smallest Bit-Line Contact of 76nm pitch on NAND Flash Cell by using Reversal PR (Photo Resist) and SADP (Self-Align Double Patterning) Process, Hwang et al., 1-4244-0653-6/07—2007 IEEE/SEMI, 3 pp.

"Frequency Doubling Using Spacer Mask", Applied Materials, U.S. Appl. No. 11/875,250, filed Oct. 19, 2007.

W. Jung et al., "Patterning with amorphous carbon spacer for expanding the resolution limit of current lithography tool", Proc. SPIE vol. 6520, 65201C, (2007).

* cited by examiner

INTEGRAL PATTERNING OF LARGE FEATURES ALONG WITH ARRAY USING SPACER MASK PATTERNING PROCESS FLOW

BACKGROUND

The application relates generally to substrate processing methods and particularly to process sequences which increase the density of features on the substrate.

Shrinking integrated circuits (ICs) may result in improved performance, increased capacity and/or reduced cost. Each device shrink requires more sophisticated techniques to form the features. Photolithography is commonly used to pattern features on a substrate. An exemplary feature is a line of a material which may be a metal, semiconductor or insulator. Linewidth is the width of the line and the spacing is the distance between adjacent lines. Pitch is defined as the distance between a same point on two neighboring lines. The pitch is equal to the sum of the linewidth and the spacing. Due to factors such as optics and light or radiation wavelength, however, photolithography techniques have a minimum pitch below which a particular photolithographic technique may not reliably form features. Thus, the minimum pitch of a photolithographic technique can limit feature size reduction.

Figure 1A:
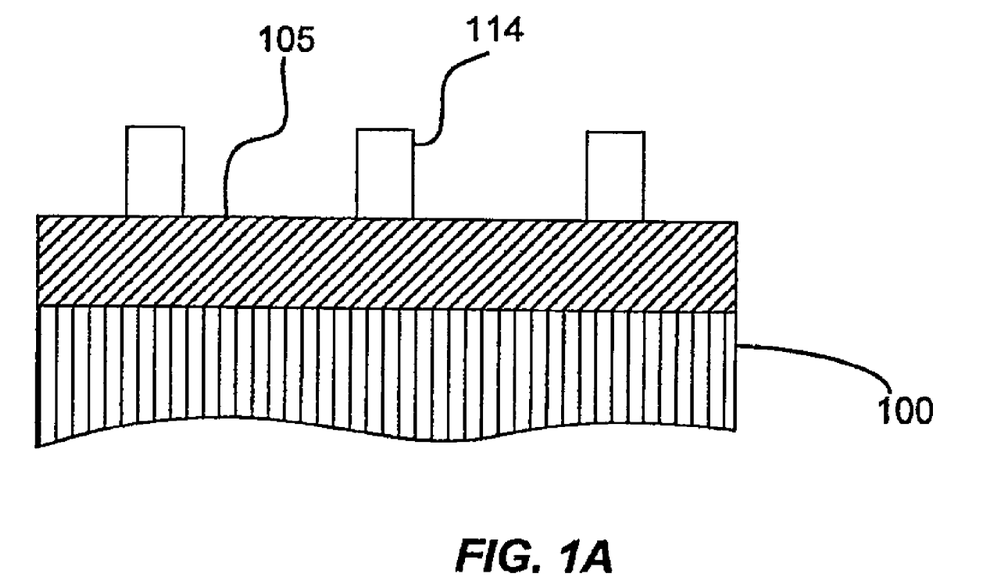
FIGS. 1A-H illustrate cross-sectional views representing a conventional self-aligned double patterning (SADP) process in accordance with the prior art.
Figure 1B:
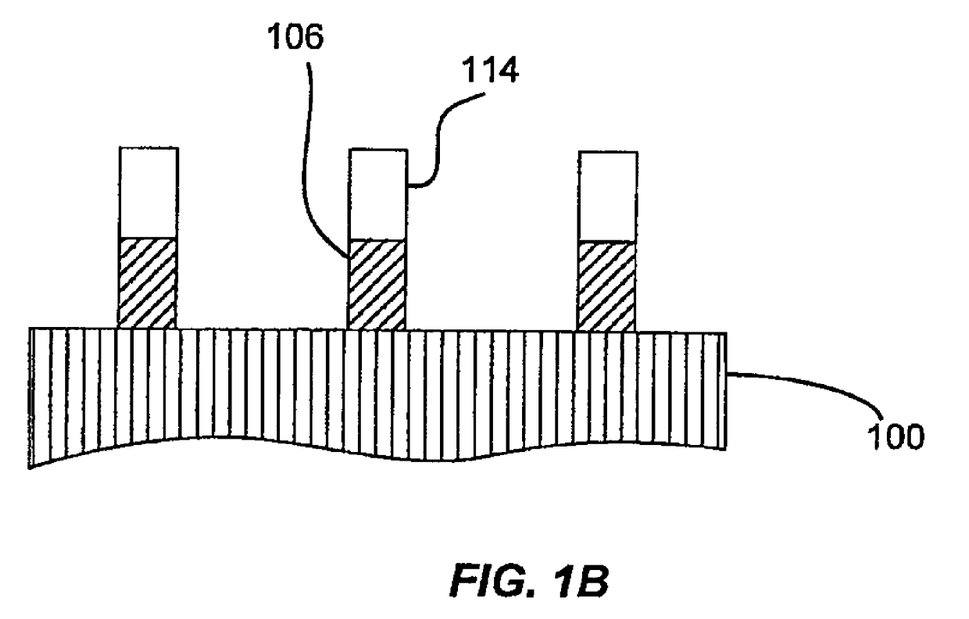
Figure 1C:
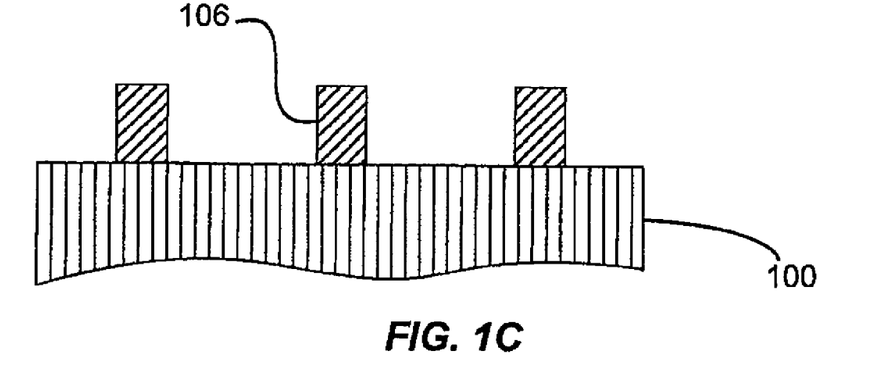
Figure 1D:
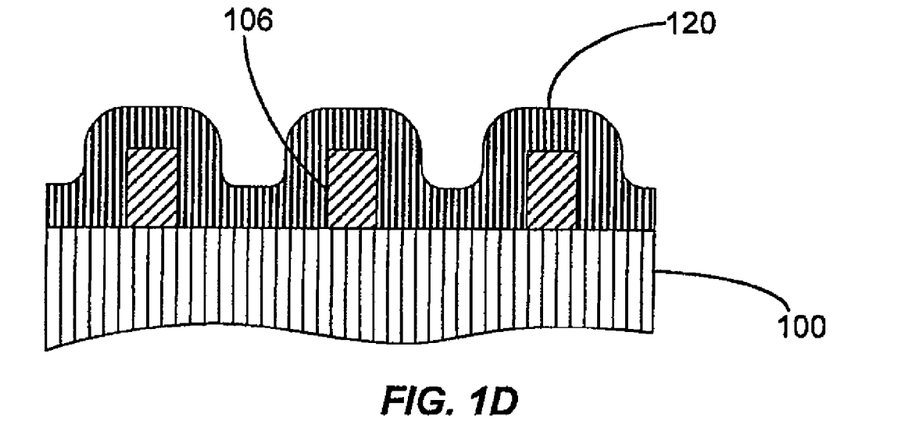
Figure 1E:
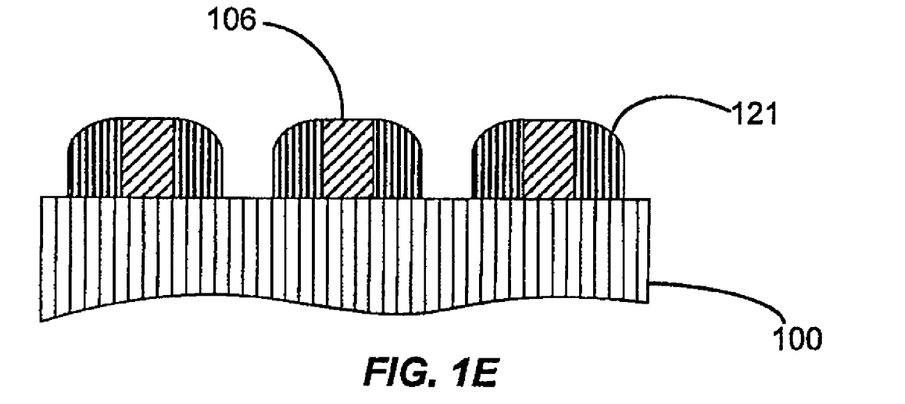
Figure 1F:
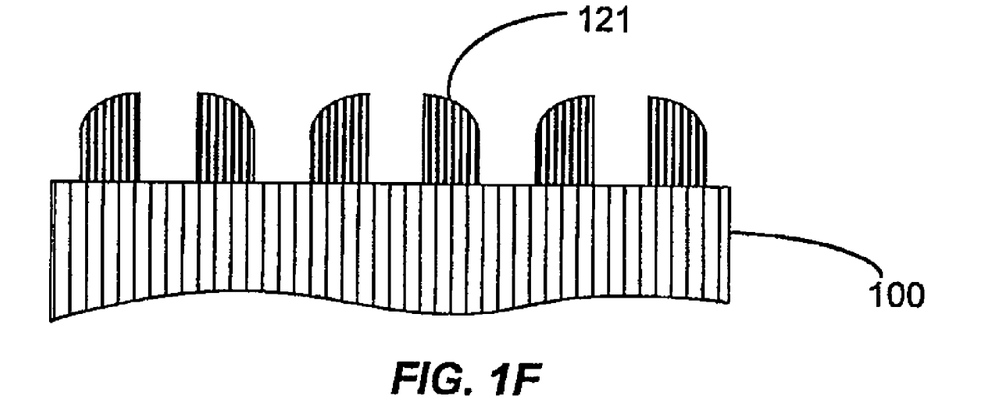
Figure 1G:
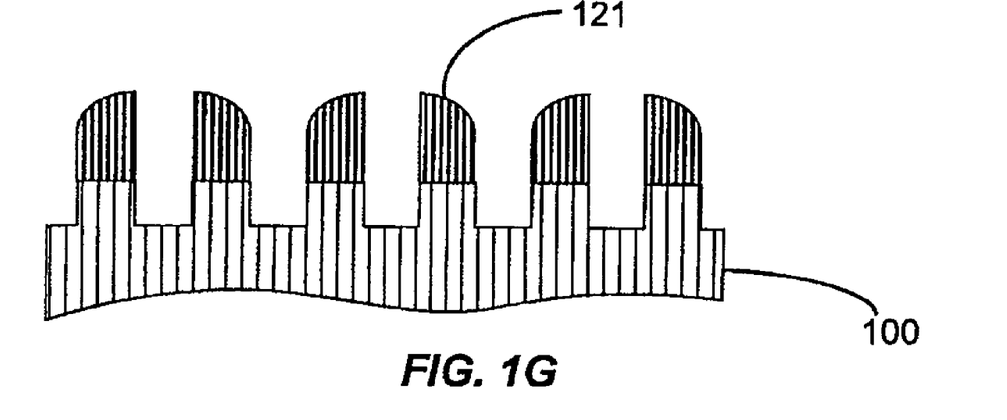
Figure 1H:
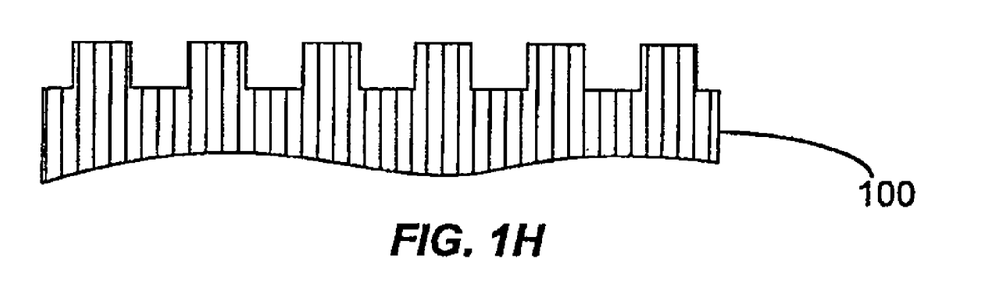

Self-aligned double patterning (SADP) is one method for extending the capabilities of photolithographic techniques beyond their supposed minimum pitch. Such a method is illustrated in FIGS. 1A-H. With reference to FIG. 1A, photolithography is used to produce a pattern of lines 114 in a photoresist layer on a sacrificial structural layer 105 formed on a substrate 100. As shown in FIG. 1B, the pattern is then transferred into sacrificial structural layer 105 using an etching process to form features referred to as placeholders, mandrels or cores 106. The photoresist lines 114 are then stripped (FIG. 1C), and conformal layer 120 of material is subsequently deposited over cores 106, as shown in FIG. 1D. Spacers 121 are then formed on the sides of cores 106 by preferentially etching the conformal material from the horizontal surfaces with an anisotropic spacer etch. The resulting structure is shown in FIG. 1E. Cores 106 may then be removed, leaving behind spacers 121 (FIG. 1F). At this point the spacers 121 may be used as an etch mask for patterning the substrate, as shown in FIG. 1G, and subsequently removed (FIG. 1H). Thus, where a given pitch of the patterned photoresist 114 included one feature, the same width now includes two features. With no change in lithographic linewidth, the pitch has been reduced.

The SADP method described above allows the spacing between adjacent lines or features to be varied but typically produces features of only a single width for a given thickness of the original conformal layer 120. Other SADP techniques, for example a negative tone version of the process of the SADP method described in FIGS. 1A-1H, allow variable width features that are spaced apart from each other by only one spacing distance.

Many integrated circuits employ features of different widths and spacing distances (spacings). Thus, some SADP techniques have been developed that employ multiple high-resolution photomasks to fabricate features of different widths and/or allow different spacings between adjacent features. Employing multiple high-resolution photomasks present alignment challenges and increase manufacturing costs.

BRIEF SUMMARY

Embodiments of the present invention pertain to methods of forming patterned features on a substrate having an increased density (i.e. reduced pitch) as compared to what is possible using standard photolithography processing techniques using a single high-resolution photomask while also allowing both the width of the patterned features and spacing (trench width) between the patterned features to vary within an integrated circuit.

In one embodiment, a method of forming patterned features on a substrate includes forming a sacrificial structural layer of a core material on the substrate; forming a protective layer of a protective material on the sacrificial structural layer; patterning the sacrificial structural layer and the protective layer to form patterned structures and regions of exposed substrate, wherein the patterned structures include at least two narrow patterned structures having a first linewidth and a first spacing and at least one wide patterned structure having a second linewidth greater than the first linewidth and wherein the narrow and wide patterned structures each include a layer of the protective material over a layer of the core material; etching the protective material such that the protective material is substantially removed from the at least two narrow patterned structures (leaving behind at least two narrow cores) and portion of the protective material remains on the at least one wide patterned structure (leaving behind a protective portion on a wide core); forming a conformal layer of a spacer material over the remaining structures and exposed substrate; anisotropically etching the conformal layer to expose the at least two narrow cores and regions of exposed substrate; and removing the at least two narrow cores.

In some embodiments, the thickness of the conformal layer is approximately equal to the first linewidth, the second linewidth is larger than the first linewidth by at least a factor of three, the layer of protective material comprises a layer of silicon oxide or silicon nitride, and/or the core material includes at least one of polysilicon, hydrogenated amorphous carbon, silicon nitride and silicon oxide.

In another embodiment, a method of patterning a substrate having a layer of protective material formed over a sacrificial layer of core material using a single high-resolution photomask includes depositing a layer of photoresist over the layer of protective material; patterning the layer of photoresist by exposing it to radiation through the single high-resolution photomask and developing it to form a first pattern defined by the high-resolution photomask, wherein the first pattern includes a plurality of narrow structures having a first width and a first pitch and at least one wide structure having a second width greater than the first width; transferring the first pattern into the layer of protective material and the layer of core material to form patterned stacks of protective material over sacrificial material including a plurality of narrow stacks corresponding to the plurality of narrow structures and at least one wide stack corresponding to the at least one wide structure; and etching the layer of protective material using a self-limiting isotropic etch process to remove substantially all protective material from the plurality of narrow stacks leaving behind a plurality of narrow cores and leaving protective material on the at least one wide stack.

In some embodiments, the method further includes forming a conformal layer of a spacer material over the remaining structures and exposed substrate; etching the conformal layer to expose the plurality of narrow cores while leaving short spacers on each side of the narrow cores and tall spacers on each side of the wide stack; stripping away the sacrificial structural material in the plurality of narrow stacks leaving short and tall spacers and leaving the wide stack; using the short and tall spacers and wide stack as a hard mask while etching the substrate to transfer a second pattern into the substrate, a portion of the second pattern having a second pitch that is less than the first pitch; and removing the short and tall spacers of spacer material and the wide stack.

In one specific embodiment, a thickness of the conformal layer on a sidewall of the narrow structures is between about 80% and about 120% of the first line width. In another specific embodiment, a thickness of the conformal layer on a sidewall of the narrow structures is between about 90% and about 110% of the first line width In some embodiments, the plurality of narrow structures is patterned at or near the resolution limit of a photolithography process, and/or the layer of protective material formed over the sacrificial layer has a thickness of at least twice the first width. In still some additional embodiments, the self-limiting isotropic etch process includes two or more cycles, and/or comprises either an HF vapor etch or exposing the substrate to $NF_3$ and at least one of $NH_3$ and $H_2$.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments of the present invention pertain to methods of forming patterned features on a substrate having an increased density (i.e. reduced pitch) as compared to what is possible using standard photolithography processing techniques using a single high-resolution photomask while also allowing both the width of the patterned features and spacing (trench width) between the patterned features to vary within an integrated circuit.

One of the most common uses of a self-aligned double patterning (SADP) process is to form high density arrays of parallel lines. A positive tone SADP process (such as the process of FIG. 1) uses the spacers as the etch mask, resulting in lines of the same width. While this lends itself readily to forming bit lines, wider lines and features (for example, pads, power supply lines, string select lines, etc.) are usually necessary on the same layer to form working devices. A negative tone SADP process introduces a gapfill material between the spacers 121 following the step shown in FIG. 1F. The gapfill material is then planarized, the spacers 121 are removed and the gapfill material serves as the etch mask. Thus, in a negative tone SADP process the trenches are the same width and the widths of the line may be varied within an integrated circuit. Removing the constraint of having constant line widths or constant trench widths enables circuit designers to use SADP with more flexibility. The methods described herein achieve this flexibility while using a single high-resolution photomask.

Figure 2:
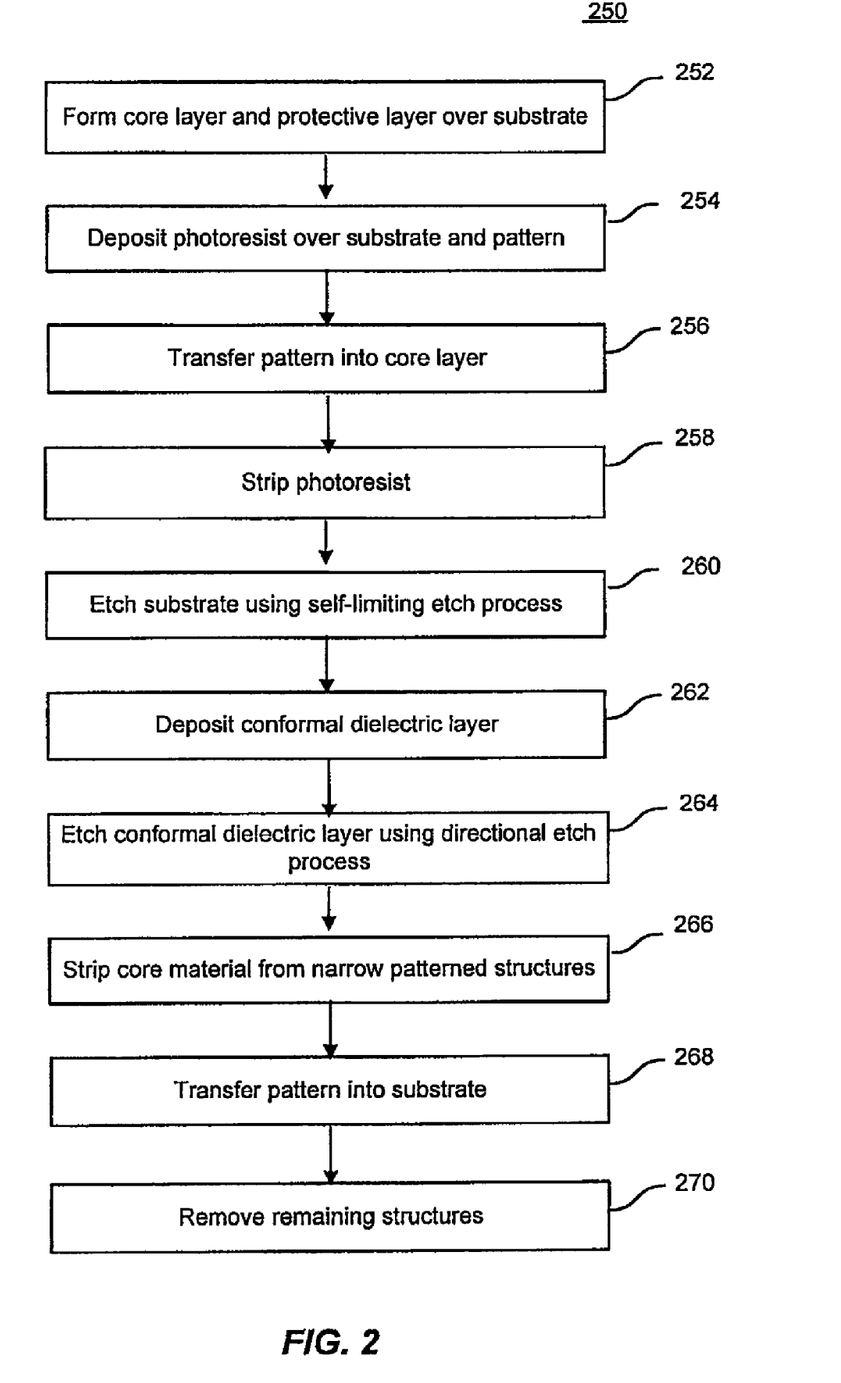
FIG. 2 is a flowchart depicting steps associated with a self-aligned double patterning process according to one embodiment of the invention.
Figure 3A:
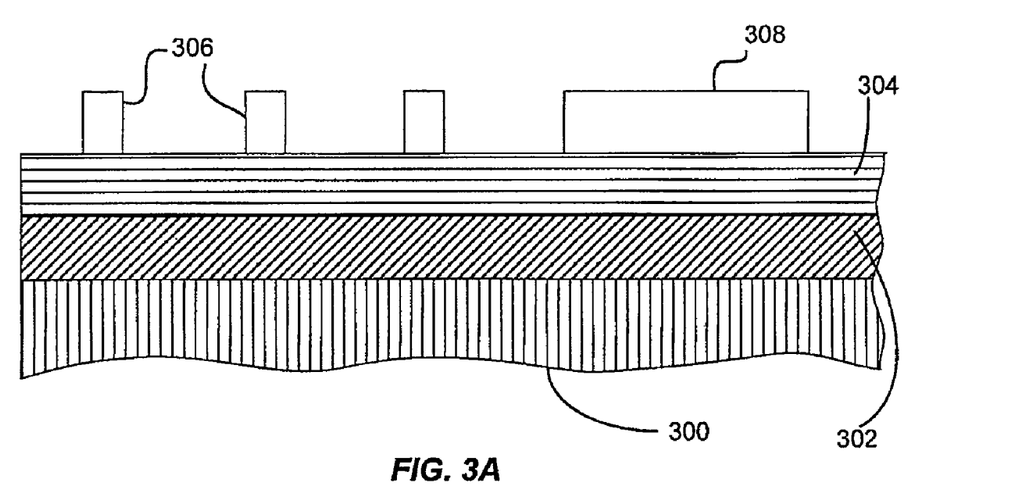
FIGS. 3A-K illustrate cross-sectional views representing a self-aligned double patterning (SADP) process according to an embodiment of the invention.

In order to better understand and appreciate the invention, reference is made to FIG. 2, which is a flowchart depicting steps associated with a self-aligned double patterning process according to one embodiment of the invention, and FIGS. 3A-K, which illustrate cross-sectional views of a structure as it is formed by the steps set forth in FIG. 2. The method starts by forming a sacrificial structural layer 302 (sometimes referred to as a core layer) on a substrate 300 and a protective layer 304 above structural layer 302 (Step 252). The stack of layers is then coated with photoresist, and the photoresist is patterned (Step 254) to form narrow patterned structures 306 and wide patterned structure(s) 308 as shown in FIG. 3A. The narrow patterned structures 306 may be patterned at or near the resolution limit of a photolithography process and the protective layer may have a thickness of at least twice the width of the narrow patterned structures 306. Narrow patterned structures 306 may, for example, be an array of narrow lines while wide patterned structure 308 may be a wide line, a pad, or other similar structure. As shown in FIG. 3A, the width of wide structure 308 can be considerably greater than that of narrow structures 306.

Figure 3B:
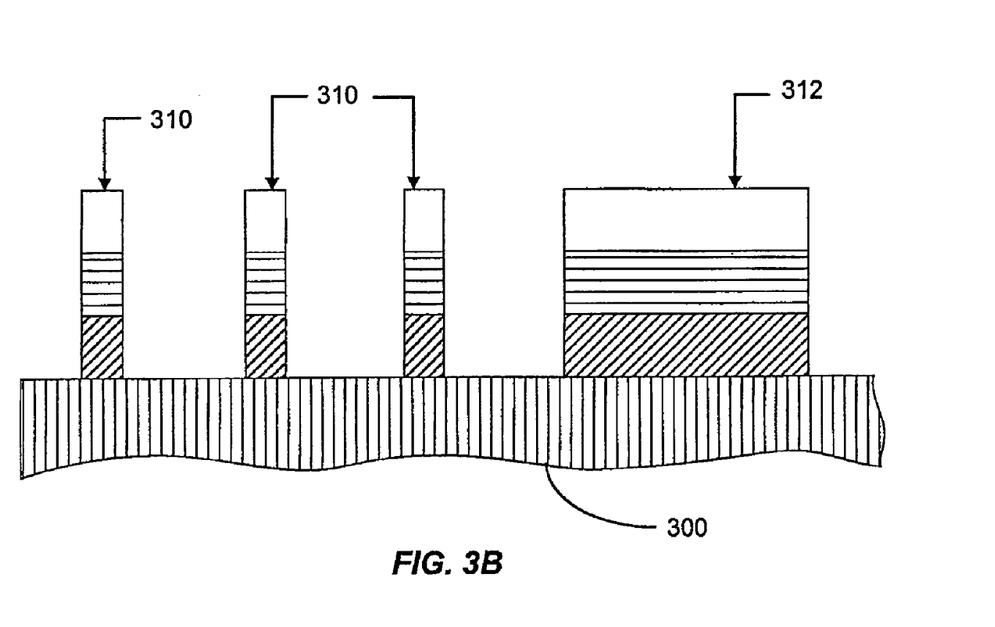
Figure 3C:
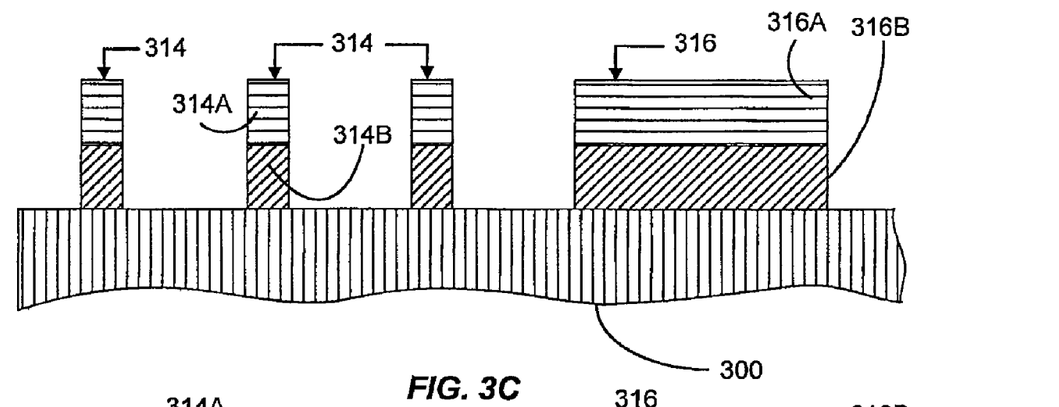

The pattern is then transferred into both protective layer 304 and sacrificial structural layer 302 (Step 256) with an etch process to form narrow structures 310 and wide structure 312 (as shown in FIG. 3B). Next, the photoresist is removed (Step 258) using, for example a standard photoresist stripping process, leaving narrow patterned structures 314 and wide patterned structures 316 as shown in FIG. 3C. Each narrow patterned structure 314 includes a stack of layers including a layer 314A of protective material formed over a layer 314B of core material. Similarly, wide patterned structure 316 includes a layer 316A of protective material formed over a layer 316B of core material.

Figure 3D:
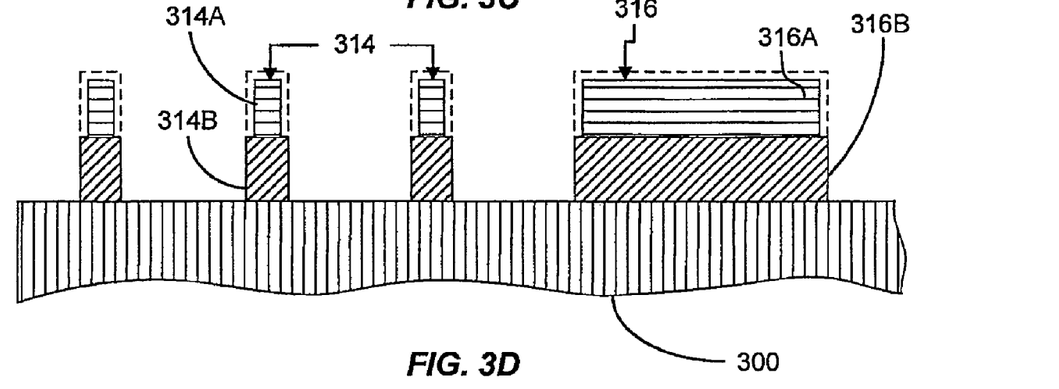
Figure 3E:
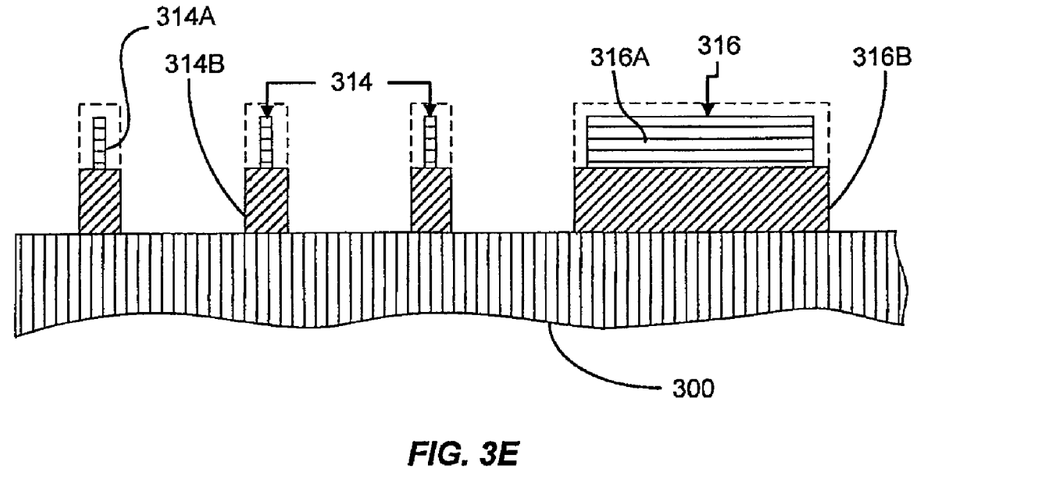
Figure 3F:
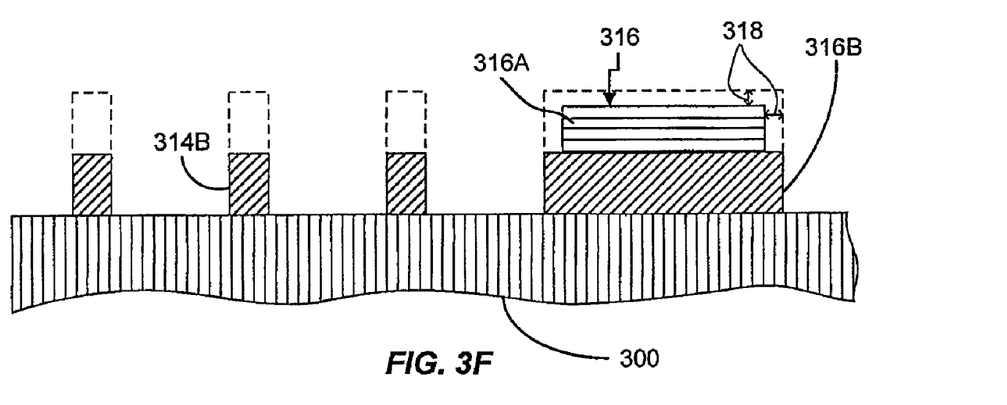

A highly-controllable isotropic etch step (Step 260) is then used to remove the layers of protective material 314A from the tops of narrow patterned structures 314 and remove a portion of the layer of protective material 316B from the top of wide patterned structure 316 as shown in FIGS. 3D-3F. As used herein, a highly-controllable isotropic etch process is an etch process that has a high degree of uniformity of etch rate regardless of the size or density of the features. Such a process etches the sidewalls and tops at nearly the same rate and can be stopped relatively abruptly. Self-limiting etch processes that can be repeated an integral number of times with each repetition removing a similar thickness from exposed surfaces of the protective material are one way to achieve this type of control. The benefits and characteristics of using a self-limiting etch will be discussed in more detail following the initial introduction of the process flow.

The patterned structures are shown in FIG. 3D after one cycle of a three cycle self-limiting etch process. The side walls and the tops of layers 314A of narrow patterned structures 314 and layers 316A of wide patterned structure 316 are etched approximately the same amount. The self-limiting etch process should exhibit a high etch selectivity to protective layer 304 as compared to core layer 302 and substrate 300. That is, the process should etch layer 304 at a much higher rate than layer 302 or substrate 300.

A second cycle of the self-limiting etch removes additional material (the same etch depth as the first cycle) and the resulting structures are shown in FIG. 3E. A third repetition of the self limiting etch completely removes the protective material 314A from atop the narrow cores 314B (shown in FIG. 3F) but leaves protective material 316A on the wide core 316B. At the end of the controllable etch process, protective material 316A is reduced in height and width. The amount of the reduction measured linearly from the top and each side is called the pull-back 318 and the magnitude shown is about half the width of the narrow cores 314B. The width of the wide core 316B may be at least a factor of three times the width of the narrow cores 314B to allow a portion of the protective material 316A to remain following the third repetition of the self-limiting etch.

Figure 3G:
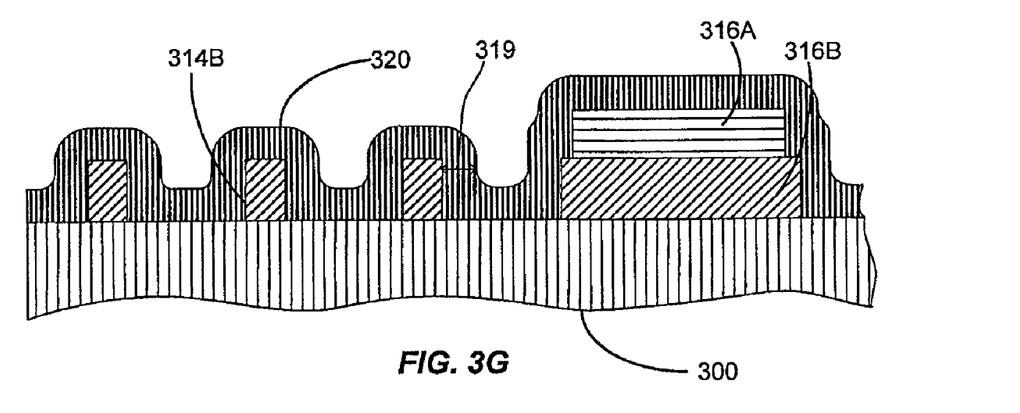

A conformal layer 320 of spacer material is then deposited on the remaining structures (Step 262) and the exposed substrate as depicted in FIG. 3G. Typically conformal layer 320 is a dielectric layer such as a SACVD silicon oxide layer or a silicon nitride layer and is preferably deposited to the thickness approximately equal to the width of narrow patterned structures 314. As used herein, conformal coverage refers to providing a generally uniform layer of material on a surface in the same shape as the surface, i.e., the surface of the layer and the surface being covered are generally parallel. A person of skill in the art will recognize that the deposited material likely cannot be 100% conformal and thus the term "generally" allows for acceptable tolerances. The conformal layer of spacer material may have a sidewall thickness 319 between about 80% and about 120% or between about 90% and about 110% of the width of the narrow cores 314B.

Figure 3H:
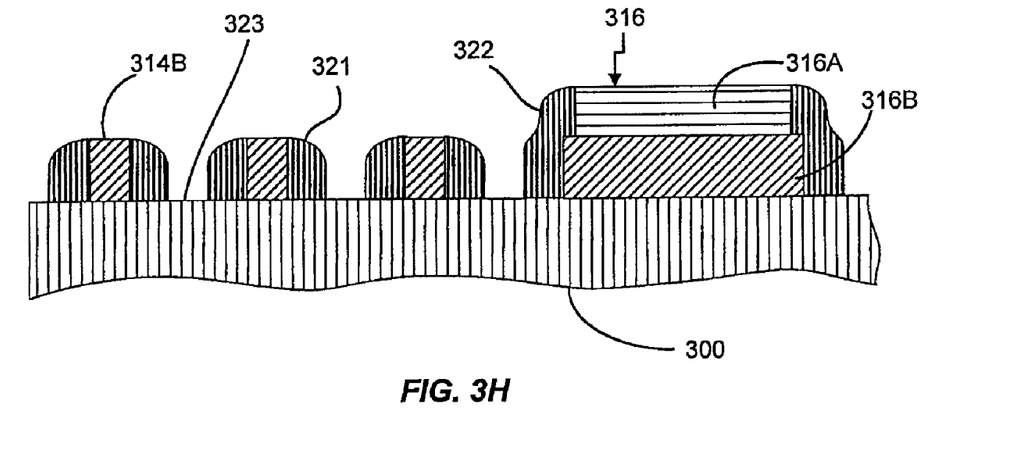

The conformal layer is then anisotropically etched (a vertical etch) to expose substrate 300 in areas 323 and expose an upper surface of each narrow core 314B (Step 264) as shown in FIG. 3H. The anisotropic etch step creates short spacers 321 on each side of the narrow cores 314B. The short spacers are leftover portions of conformal layer 320. The anisotropic etch typically removes the conformal material from atop wide patterned feature 316 but leaves at least a portion of protective material 316A above the wide core 316B. The anisotropic etch also leaves behind tall spacers 322 which adjoin both wide core 316B and remaining protective material 316A. Thus, wide core 316B may be bordered by the substrate 300 below, tall spacers 322 on each side and protective material 316A above. No portion of the wide core is exposed at this stage of processing in order to maintain mask integrity during subsequent steps.

Figure 3I:
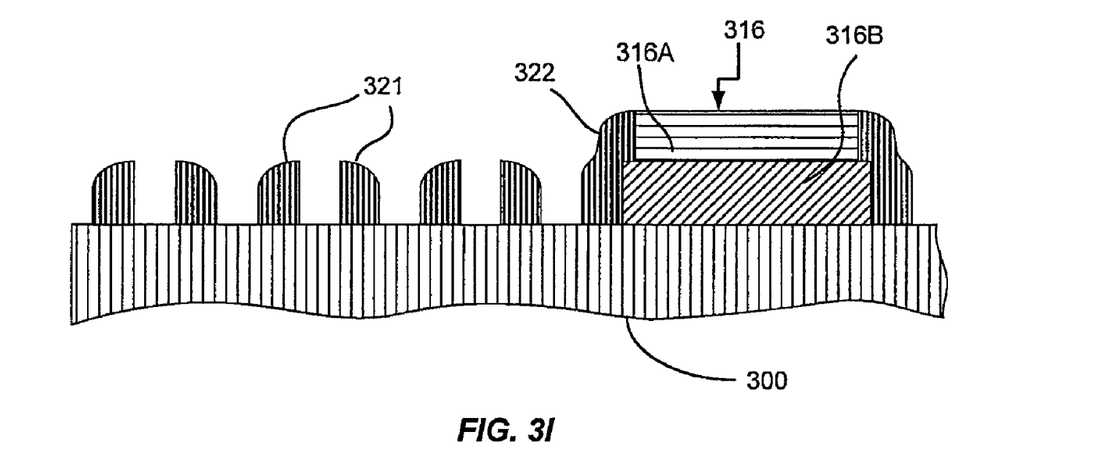

Next, the exposed core material is removed (Step 266) in an etch step leaving short spacers 321 along with the remaining wide patterned structure 316 surrounded by tall spacers 322 as shown in FIG. 3I. The etch step used to remove the core material exhibits a high selectivity in etching the core material relative to the protective material above the wide core and the conformal material of the spacers (the spacer material).

Figure 3J:
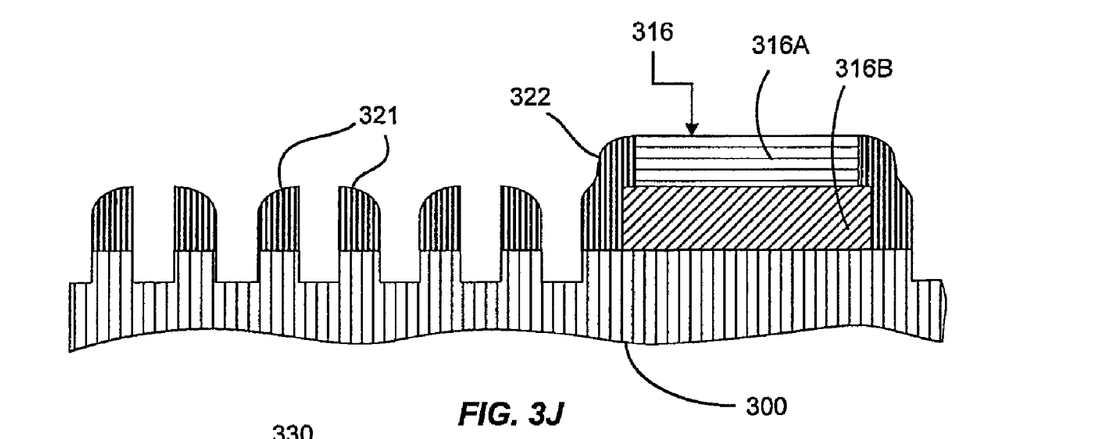
Figure 3K:
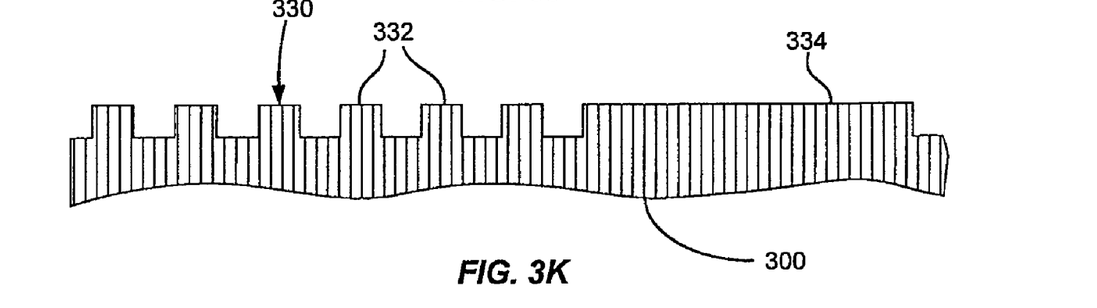

The protective material remains substantially intact or sustains incomplete erosion during the core-etch process. The remaining features, including short spacers 321, tall spacers 322 and wide patterned structure 316, are then used as a hard mask during an etch step that transfers the pattern defined by short spacers 321 into exposed substrate 300 (Step 268) as shown in FIG. 3J. Then, the short spacers 321, tall spacers 322, protective material 316A and core material 316B can be removed (Step 270) leaving a substrate 300 shown in FIG. 3K that includes a pattern etched therein that has a pitch in a narrow pattern area 330 essentially half that of the pitch formed by the photolithography process discussed with respect to FIG. 3A. Substrate 300 also includes both narrow patterned features 332 and a wide patterned feature 334.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. There is also considerable flexibility in the choice of materials used for the cores, the protective layer and the spacers. Exemplary material systems may be helpful in explaining additional details of self-aligned double patterning processes according to disclosed embodiments. In a first example, the sacrificial structural layer 302, protective layer 304 and conformed layers 320 are amorphous carbon, silicon oxide and silicon nitride, respectively. The amorphous carbon film may be Advanced Patterning Film™ (APF) made by Applied Materials of Santa Clara, Calif. APF is described in U.S. Pat. No. 6,573,030, which issued on Jun. 3, 2003, and which is herein incorporated by reference in its entirety for all purposes.

The core-etch may involve ashing the amorphous carbon cores to attain the configuration of FIG. 3I. Ashing is often done by introducing $O_2$ or $O_3$ into a plasma above the substrate to oxidize the amorphous carbon and pumping the by-products away. The ashing process can also involve halogen-containing gases. Regardless of the precursors used, tall spacers 322 and protective layer 316A keep the plasma-excited ashing agent from chemically reacting with wide core 316B. This protection is desirable in order to avoid etching the substrate underneath the wide compound feature 316,322 in FIG. 3H. In order for the tall spacers 322 to protect wide core 316B, the etch process used to remove protective material 314A from atop the narrow cores 314B of FIG. 3F should have a small over-etch.

Any etch process used for this step will have at least some over-etch to ensure that substantially all the protective material is removed from atop the narrow cores 314B. Most etch processes require a significant over-etch which results in the removal of much more material from some features due to inherent variability of the etch rates across a wafer, multiple wafers and batches of wafers. There are many causes for this variability including process non-uniformities and microloading which describes a difference of the etch rate in regions of high etchable surface area compared to regions of low etchable surface area. Regions of high etchable surface area consume etch gases more rapidly, slowing the net etch rate nearby. Wet processes also suffer from an inability to simultaneously remove the etching agent from all parts of a wafer or batch of wafers in an abrupt fashion.

As a result, etch processes may target a 100% (2×) over-etch in order to ensure that slowly etched regions will clear, in this case, protective material 314A from atop narrow cores 314B. A 100% over-etch means that some features will experience less than 100% but many features will experience more than 100% of an over-etch. As a result of the insurance margin, the process consumes more material than is necessary impacting the process flow. The distance which protective material 316A above the wide core recedes will be referred to as the pull-back 318. The pull-back can become large enough to create a gap near the center of the tall spacers 322 as the over-etch approaches 100%. A gap in the tall spacers 322 large enough to allow the ashing agent to penetrate, may result in significant oxidation of the wide core 316B and may expose a portion of the substrate 300.

A highly-controllable etch process, characterized by high uniformity and a relatively abrupt termination may be used. In a self-limiting etch process, a gas or vapor (etching agent) may react with a surface to form solid by-products which are subsequently removed. The solid by-products limit the thickness of the surface which is allowed to react with the etching agent. Process parameters such as gas concentration and substrate temperature help determine the thickness removed from the material before the process slows considerably. This self limiting etch process sequence can be repeated an integral number of times to remove a selectable total thickness. The process parameters can be chosen so the number of cycles can provide a balance between throughput and accuracy of the total thickness removed. Though the self-limiting etch process exhibits very high uniformity and etch-rate control, disclosed embodiments are not limited to self-limiting etch processes. Other etch processes may exhibit the uniformity and control needed to avoid creating gaps in the tall spacers 322. In embodiments, well-controlled etch processes may require an over-etch of less than about 50% in order to clear protective material 314A from atop narrow cores 314B. Process flows which utilize other well-controlled etch processes are also within the scope of embodiments and claims outlined herein.

The protective layer may be made of either silicon nitride or silicon oxide in different embodiments. Mature self-limiting etch processes are available for silicon oxide but not for silicon nitride at present resulting in the use of silicon dioxide for the protective layer of the first example. A self-limiting etch process tailored for silicon oxide involves exposing the surface to HF vapor which forms a solid by-product stifling further reaction until the solid by-products are removed. A sequence of paired steps alternating HF vapor exposure and removal of solid by-products may be repeated and may provide nearly atomic layer control of etch rate. Higher etch rates may be achieved with a self-limiting etch process by sacrificing some control of the etch rate. HF vapor may be created by flowing precursors (e.g. $NH_3$ or $H_2$ and $NF_3$) into the substrate processing chamber through separate channels. After entering the chamber, the precursors react to form HF vapor. An HF vapor technique is integrated into several products from Applied Materials, Santa Clara, Calif.

The oxygen content in the protective layer 316A near the interface with the wide amorphous carbon core 316B can cause ashing. This may compromise the integrity of wide features. To avoid ashing the deposition of silicon oxide may begin with a silicon-rich interface and transition to the normal stoichiometry of silicon oxide thereafter. The silicon rich interface has less oxygen content and suppresses ashing of the wide core 316B.

The choice of materials used for sacrificial structural layer (cores) 302 protective layer 304 and conformal layer (spacers) 320 may be different from those described thus far. In general, for a sacrificial structural layer 302 of amorphous carbon and a silicon substrate 300, the protective layer 304 may be silicon oxide or silicon nitride since etching agents are available with high silicon selectivity over both silicon oxide and silicon nitride. This allows trenches to be etched in the substrate without completely removing the protective layer. Notably, since the process flow described in relation to FIGS. 2A-K is geometric in nature, other substrates may be used and other material layers may be used on top of a silicon substrate which would then make other materials appropriate for these roles. In disclosed embodiments, the spacers may be silicon oxide, silicon nitride or polysilicon. Using silicon oxide for the spacers with amorphous carbon cores creates a silicon oxide amorphous carbon interface which may benefit from the creation of a silicon rich interface to prevent ashing.

Generalizing the material choices further, in order to obtain the benefits of the process flows described herein, the etch rate of the cores 314B should be higher than the etch rate of the short spacers 321. The difference enables the cores 314B to be removed while leaving at least a portion the short spacers 321 to protect the underlying substrate in a positive tone process. Etch process gases and etch rates are often similar for silicon nitride and silicon oxide. Removing a silicon nitride core while leaving a silicon oxide spacer (or vice versa) may require an exotic etch and probably not be a likely choice. However, polysilicon may be used for the cores in combination with silicon nitride or silicon oxide spacers and protective layers. In embodiments, the core material may be polysilicon, hydrogenated amorphous carbon, silicon nitride or silicon oxide. Hydrogenated amorphous carbon may have an atomic composition of between about 10 percent hydrogen to about 60 percent hydrogen.

Polysilicon may also be used for the spacers while silicon nitride and silicon oxide are used for the cores and protective material. The protective material and the spacer material should both be able to withstand the etch and ash processes which remove the cores as well as those which form the trenches. In different embodiments, the protective material is a combination of amorphous carbon and hydrogen (hydrogenated amorphous carbon), silicon nitride or silicon oxide.

The description above has been given to help illustrate the principles of the present invention. It is not intended to limit the scope of the invention in any way. A large variety of variants are apparent, which are encompassed within the scope of this invention. For example, while one particular embodiment of the invention was described in conjunction with FIGS. 3D-3F as employing a three step self-limiting etch process where each of the steps removed the same amount of material, the invention is not so limited. For example, in one embodiment, the self-limiting etch step can remove the entire portion of protective material 314A in a single step. In other embodiments, the self-limiting etch step can be repeated any reasonable integral number of times to achieve the desired result. Furthermore, the amount of material removed in each integral etch step can vary if, for example, the temperature of the substrate or reaction is changed from one step to another. Also, while the invention has been described in detail and with reference to specific examples thereof, it will be apparent to one skilled in the art that various changes and modifications can be made therein without departing from the spirit and scope thereof. These equivalents and alternatives are intended to be included within the scope of the present invention.

What is claimed is:

1. A method of forming patterned features on a substrate, the method comprising:
    forming a sacrificial structural layer of a core material on the substrate;
    forming a protective layer of a protective material on the sacrificial structural layer;
    patterning the sacrificial structural layer and the protective layer to form patterned structures and regions of exposed substrate, the patterned structures including at least two narrow patterned structures having a first linewidth and a first spacing and at least one wide patterned structure having a second linewidth which is greater than the first linewidth, the narrow and wide patterned structures each comprising a layer of the protective material over a layer of the core material;

etching the protective material such that the protective material is substantially removed from the at least two narrow patterned structures (leaving behind at least two narrow cores) and a portion of the protective material remains on the at least one wide patterned structure (leaving behind a protective portion on a wide core);

forming a conformal layer of a spacer material over the remaining structures and exposed substrate;

anisotropically etching the conformal layer to expose the at least two narrow cores and regions of exposed substrate; and removing the at least two narrow cores.

2. The method of claim 1 further comprising:
etching the regions of exposed substrate to a predetermined depth; and
removing remaining spacer material, remaining protective material and remaining core material.

3. The method of claim 1 wherein the step of forming a conformal layer of a spacer material comprises forming a conformal layer of a spacer material, wherein a thickness of the conformal layer is approximately equal to the first linewidth.

4. The method of claim 1 wherein the step of patterning the sacrificial structural layer comprises patterning the sacrificial structural layer, wherein the second linewidth is larger than the first linewidth by at least a factor of three.

5. The method of claim 1 wherein forming a protective layer of protective material comprises forming a layer of silicon oxide.

6. The method of claim 5 wherein forming a protective layer of protective material comprises forming an initial thin layer of silicon-rich silicon oxide over the core material and then forming a bulk layer of silicon oxide over the initial thin layer of silicon-rich silicon oxide.

7. The method of claim 1 wherein forming a protective layer of protective material comprises forming a layer of silicon nitride.

8. The method of claim 1, wherein forming a sacrificial structural layer of a core material comprises forming a sacrificial structural layer of a core material, wherein the core material comprises at least one of polysilicon, hydrogenated amorphous carbon, silicon nitride and silicon oxide.

9. The method of claim 1 wherein forming a sacrificial structural layer of a core material comprises forming a sacrificial structural layer of a core material, wherein the core material comprises hydrogenated amorphous carbon having a atomic composition of between about 10 percent hydrogen to about 60 percent hydrogen.

10. The method of claim 1 wherein forming a conformal layer of a spacer material comprises forming a conformal layer of a spacer material, wherein the spacer material comprises at least one of polysilicon, silicon nitride and silicon oxide.

11. A method of patterning a substrate having a layer of protective material formed over a sacrificial layer of core material using a single high-resolution photomask, the method comprising:
depositing a layer of photoresist over the layer of protective material;
patterning the layer of photoresist by exposing the layer of photoresist to radiation through the single high-resolution photomask and developing the layer of photoresist to form a first pattern defined by the high-resolution photomask, the first pattern including a plurality of narrow structures having a first width and a first pitch and at least one wide structure having a second width greater than the first width;
transferring the first pattern into the layer of protective material and the layer of core material to form patterned stacks of protective material over sacrificial material including a plurality of narrow stacks corresponding to the plurality of narrow structures and at least one wide stack corresponding to the at least one wide structure; and
etching the layer of protective material using a self-limiting isotropic etch process to remove substantially all protective material from the plurality of narrow stacks leaving behind a plurality of narrow cores and leaving protective material on the at least one wide stack.

12. The method of claim 11 further comprising:
forming a conformal layer of a spacer material over the remaining structures and exposed substrate;
etching the conformal layer to expose the plurality of narrow cores while leaving short spacers on each side of the narrow cores and tall spacers on each side of the wide stack;
stripping away the sacrificial structural material in the plurality of narrow stacks leaving short and tall spacers and leaving the wide stack;
using the short and tall spacers and wide stack as a hard mask while etching the substrate to transfer a second pattern into the substrate, a portion of the second pattern having a second pitch that is less than the first pitch; and
removing the short and tall spacers of spacer material and the wide stack.

13. The method of claim 12 wherein the step of forming a conformal layer of a spacer material comprises forming a conformal layer of spacer material, wherein a thickness of the conformal layer on a sidewall of the narrow structures is between about 80% and about 120% of the first line width.

14. The method of claim 12 wherein the step of forming a conformal layer of a spacer material comprises forming a conformal layer of spacer material, wherein a thickness of the conformal layer on a sidewall of the narrow structures is between about 90% and about 110% of the first line width.

15. The method of claim 11 wherein the step of patterning the layer of photoresist comprises patterning the layer of photoresist, wherein the plurality of narrow structures is patterned at or near the resolution limit of a photolithography process.

16. The method of claim 11 wherein the layer of protective material formed over the sacrificial layer has a thickness of at least twice the first width.

17. The method of claim 11 wherein the self-limiting isotropic etch process comprises two or more cycles.

18. The method of claim 11 wherein the self-limiting isotropic etch process comprises an HF vapor etch.

19. The method of claim 11 wherein the self-limiting isotropic etch process comprises flowing at least two precursors: $NF_3$ and at least one of $NH_3$ and $H_2$.

20. The method of claim 11 wherein the layer of protective material comprises silicon oxide and the core material comprises hydrogenated amorphous carbon.

21. The method of claim 12 wherein the second pitch is half of the first pitch.

22. The method of claim 12 wherein both variable width lines and variable width spaces are produced.

* * * * *